United States Patent [19]

Nitardy

[11] Patent Number: 5,339,041
[45] Date of Patent: Aug. 16, 1994

[54] HIGH EFFICIENCY POWER AMPLIFIER

[75] Inventor: John H. Nitardy, Seattle, Wash.

[73] Assignee: The Boeing Company, Seattle, Wash.

[21] Appl. No.: 88,201

[22] Filed: Jul. 6, 1993

[51] Int. Cl.$^5$ .................. H03F 3/38; H04L 27/04
[52] U.S. Cl. ............................. 330/10; 375/68
[58] Field of Search ............ 330/10, 107 P, 251; 375/59, 68

[56] References Cited

U.S. PATENT DOCUMENTS

| | | | |
|---|---|---|---|
| 3,413,570 | 11/1968 | Bruene et al. | 332/9 |
| 3,467,876 | 9/1969 | Tatsuzawa et al. | 328/150 |
| 3,486,128 | 12/1969 | Lohrmann | 330/40 |
| 3,526,791 | 9/1970 | Codichini | 307/310 |
| 3,528,011 | 9/1970 | Anderson | 325/38 |
| 3,624,560 | 11/1971 | Milton | 332/31 R |
| 4,045,743 | 8/1977 | Walker | 328/150 |
| 4,593,287 | 6/1986 | Nitardy | 343/17.5 |

FOREIGN PATENT DOCUMENTS 550094 12/1942 United Kingdom .

OTHER PUBLICATIONS

C. P. Avratoglou et al., "Analysis and Design of a Generalized Class E Tuned Power Amplifier," IEEE Transactions on Circuits and Systems, vol. 36, No. 8, Aug. 1989, pp. 1068–1079.
G. B. Harrold, "Radio–Frequency Amplifiers," Amplifiers and Oscillators, pp. 13–35 through 13–45.
M. K. Kazimierczuk et al., "Class E Tuned Power Amplifier with Antiparallel Diode or Series Diode at Switch, with Any Loaded Q and Switch Duty Cycle," IEEE Transactions on Circuits and Systems, vol. 36, No. 9, Sep. 1989, pp. 1201–1209.

Primary Examiner—William L. Sikes
Assistant Examiner—Fetsum Abraham
Attorney, Agent, or Firm—Christensen, O'Connor, Johnson & Kindness

[57] ABSTRACT

A high-efficiency amplifier (10, 18) that may be used in, for example, a radar system to amplify signals received at an exciter (22) before they are applied to an antenna (20). The amplifier includes, among other components, an adaptive matching network (48) that is controlled by a processing system (26) to allow the amplifier to be adaptively matched to the load as the operating frequency of the system undergoes changes. Specifically, the network is adjusted based upon information regarding the ratio R of reflected power over incident power measured at the load the last time the system operated at the same frequency. As a result, the system is able to respond more quickly to frequency changes.

9 Claims, 5 Drawing Sheets

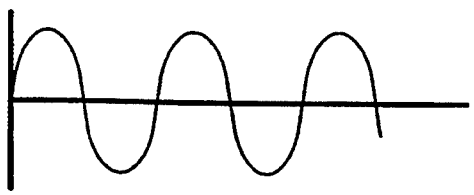
Fig.4.  FROM EXCITER 22
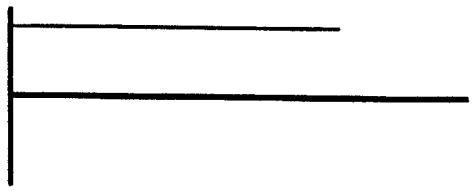
Fig.5.  FROM ENVELOPE DETECTOR 38
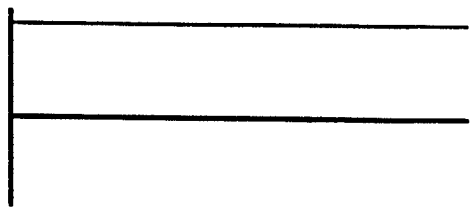
Fig.6.  FROM EFFICIENT POWER SUPPLY 40
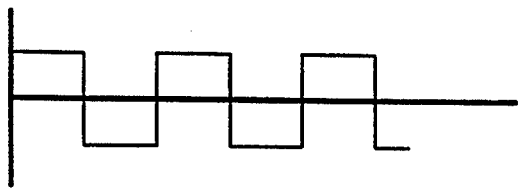
Fig.7.  FROM PULSE SHAPER 42
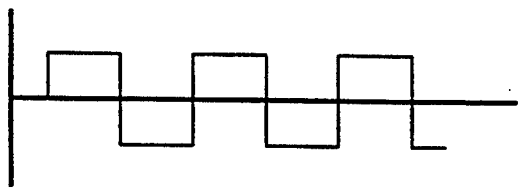
Fig.8.  FROM DELAY 44
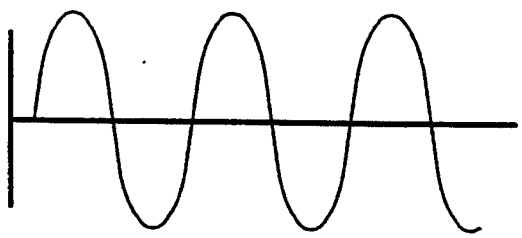
Fig.9.  FROM SMSS 46
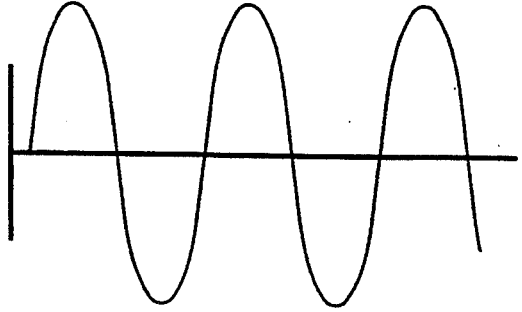
Fig.10.  FROM NETWORK 48

HIGH EFFICIENCY POWER AMPLIFIER

FIELD OF THE INVENTION

This invention relates generally to amplifiers and more particularly, to amplifiers constructed to exhibit relatively high efficiencies.

BACKGROUND OF THE INVENTION

Amplifiers are widely used to amplify electric signals received from one part of a circuit for use in another part of the circuit. Commonly, the electrical signal to be amplified is an alternating current (AC) signal exhibiting a time-varying electric potential or voltage. The amplifier is then required to preserve the time varying nature of the voltage, while simultaneously amplifying the voltage by some controlled factor or gain.

As suggested, amplifiers are used in a variety of applications. For example, amplifiers are commonly employed in communication systems to amplify signals received from an antenna for processing by a receiver, or to amplify signals received from a transmitter for broadcast via the antenna. Similarly, amplifiers are used in radar systems to amplify signals received from, and applied to, the system antennas.

Because the construction and operation of amplifiers also varies considerably, amplifiers are commonly separated into classes on the basis of their performance characteristics. For example, Class A amplifiers are biased for maximum power output even when substantially no AC input is received and, as a result, have a relatively low efficiency on the order of 25 percent. In contrast, Class B amplifiers are advantageously biased near cutoff when no AC input signal is applied and have a higher efficiency on the order of 60 percent.

For the purposes of the ensuing discussion, one class of amplifier that is of particular interest is the Class E amplifier. Class E amplifiers are commonly used in switching power supplies and are designed to deliver maximum power to the load, rather than maximum voltage gain. Such amplifiers are, therefore, referred to as Class E "power" amplifiers.

The general construction and operation of Class E power amplifiers for radio-frequency (RF) applications is discussed in, for example, Avratoglou et al., *Analysis and Design of a Generalized Class E Tuned Power Amplifier*, IEEE Transactions on Circuits and Systems, Vol. 36, pp. 1068–79 (1989) and Kazimierczuk et al., Class E Tuned Power Amplifier with Antiparallel Diode or Series Diode at Switch, with Any Loaded Q and Switch Duty Cycle, IEEE Transactions on Circuits and Systems, Vol. 36, pp. 1201–09 (1989).

In that regard, a conventional Class E amplifier may include a transistor switch, load network, and radio-frequency (RF) choke. The load network is represented by a resistive load R, a switch parasitic capacitance and parasitic shunt capacitance $C_1$, and a series inductance L and capacitance C. The RF choke is included to ensure a substantially direct current (DC) supply.

The amplifier operates in the following manner. When the switch is closed, a series resonant circuit including the inductance L, capacitance C, and load R is formed and an output current flows through the switch. When the switch is open, a series resonant circuit including the inductance L, capacitance C, load R, and capacitance $C_1$ is formed and an output current flows through the capacitance $C_1$, producing a voltage $V_S$ across the switch. For efficient operation, the voltage $V_S$ and its rate of change are preferably zero when the switch closes, ensuring that no energy will be stored in capacitance $C_1$. The efficiency of such amplifiers may be on the order of roughly 90 percent.

As will be appreciated, the efficient operation of the Class E amplifier is advantageous for a number of reasons. For example, an amplifier having a relatively high efficiency dissipates less heat than an amplifier of lower efficiency, reducing circuit cooling requirements and typically extending amplifier life. In addition, a relatively efficient amplifier allows higher RF power output levels to be achieved for a given input power.

While higher output levels can sometimes be achieved by increasing the input current, such adjustments are not always practical. For example, an aircraft communication or radar system is typically wired for some preset maximum current level that might be exceeded by an increase in input current levels. By using a more efficient amplifier, however, higher power output levels could be achieved without requiring the system to be rewired.

Unfortunately, conventional Class E amplifiers cannot necessarily be used to full advantage in many communication and radar applications. For example, a Class E amplifier operates efficiently when its output impedance is either very low (near zero ohms) or very high (an open circuit). As a practical matter, however, the output impedance commonly varies with time and frequency. Because the operating frequency of many communication and radar systems may intentionally be adjusted over broad ranges, the operation of a conventional Class E amplifier in such systems will be adversely affected.

In view of the foregoing discussion, it would be desirable to provide an amplifier exhibiting a relatively high efficiency. It would further be desirable for the efficiency of the amplifier to be substantially independent of variations in, for example, the operating frequency of the amplifier.

SUMMARY OF THE INVENTION

In accordance with this invention, an amplifier is provided for processing an input signal to produce an amplified output signal. The input signal has a modulated envelope and a frequency that may shift among a plurality of different frequencies. The amplifier includes a pulse-shaping device for processing the input signal to produce a shaped signal exhibiting the same frequency and phase as the input signal. An envelope detection device is included to process the input signal to produce an envelope signal that represents the envelope of the input signal. A power supply is included for tracking and amplifying the envelope signal to produce a supply signal. A switch mode source device is included for receiving the shaped signal and the supply signal and for producing an amplified signal whose phase and frequency are determined by the shaped signal and whose envelope is modulated by the supply signal. An adaptive matching device may also be included for receiving the amplified signal, controlling the output impedance of the amplifier as the frequency of the input signal is shifted among the plurality of different frequencies, and providing the amplified signal as an output of the amplifier.

In accordance with another aspect of this invention, an adaptive matching network is disclosed for adaptively coupling the output of an amplifier to a load. The adaptive matching network includes a first varactor having a first and second terminal. A second varactor is also included having a first and second terminal. The first terminals of the first and second varactors define a first network control junction. The second terminals of the first and second varactors are coupleable to the output of the amplifier, with the second terminal of the second varactor also being coupleable to the load. The adaptive matching network also includes an inductor having a first and second terminal, with the first terminal of the inductor being coupled to the second terminal of the first varactor. Finally, the adaptive matching network includes a third varactor, having a first and second terminal, and a fourth varactor, having a first and second terminal. The first terminals of the third and fourth varactors define a second network control junction. The second terminal of the third varactor is coupled to the second terminal of the inductor and the second terminal of the fourth varactor is coupled to the load. Fifth and sixth varactors may also be added to the network, or several arrays of pin diodes and capacitors used in place of the varactors.

In accordance with another aspect of this invention, a method is disclosed of adaptively matching an amplifier to a load when the amplifier is operable at various frequencies. The method includes the steps of determining the frequency the amplifier is being operated at and sensing the degree to which the amplifier is matched to the load for the frequency. A signal representative of matching between the amplifier and the load at the frequency is then stored. The steps of determining, sensing, and storing are then repeated for each new frequency at which the amplifier is operated. Finally, the operation of an adaptive matching network coupling the amplifier to the load is adjusted in response to the representation of the matching at the new frequency.

In accordance with one last aspect of the invention, a method is disclosed of controlling an adaptive matching network to adaptively match an amplifier, which is operable at a plurality of different operating frequencies, to a load. The method includes the step of measuring the power delivered to the load when the operating frequency of the amplifier is at a first level to determine matching network variables. A representation of the matching network variables when the operating frequency of the amplifier is at the first level is then stored. The representation of the matching network variables is recalled the next time the operating frequency of the amplifier is at the first level. Finally, the operation of the adaptive matching network is adjusted in response to the recalled representation.

BRIEF DESCRIPTION OF THE DRAWINGS

The foregoing aspects and many of the attendant advantages of this invention will become more readily appreciated when taken in conjunction with the accompanying drawings, wherein:

FIGS. 4 through 10 are graphs depicting the signals processed at various points within the amplifier of FIG. 3;

DETAILED DESCRIPTION OF THE PREFERRED EMBODIMENT

Figure 1:
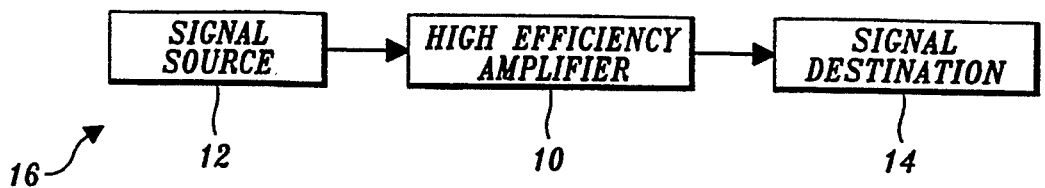
FIG. 1 is a block diagram of a system employing a high-efficiency amplifier constructed in accordance with the invention.

Referring now to FIG. 1, a high-efficiency amplifier 10, constructed in accordance with this invention, is shown. The amplifier 10 is designed to amplify the output of a signal source 12 before it is applied to a signal destination 14. Collectively, these components form a system 16, which may be, for example, a radar or communication system.

The construction and operation of the signal source 12 and signal destination 14 depend upon the nature of system 16. These components are conventional and are discussed only briefly in the ensuing discussion. The high-efficiency amplifier 10, on the other hand, is not conventional and has a number of advantages over prior art amplifiers.

More particularly, amplifier 10 is constructed and operated to exhibit a relatively high efficiency on the order of 90 percent or more. As a result, the amplifier 10 exhibits relatively low power requirements, generates relatively small amounts of heat, is quite reliable and is relatively small. The amplifier 10 also advantageously allows these objectives to be achieved substantially independent of variations in the operating frequency of the system 16.

Figure 2:
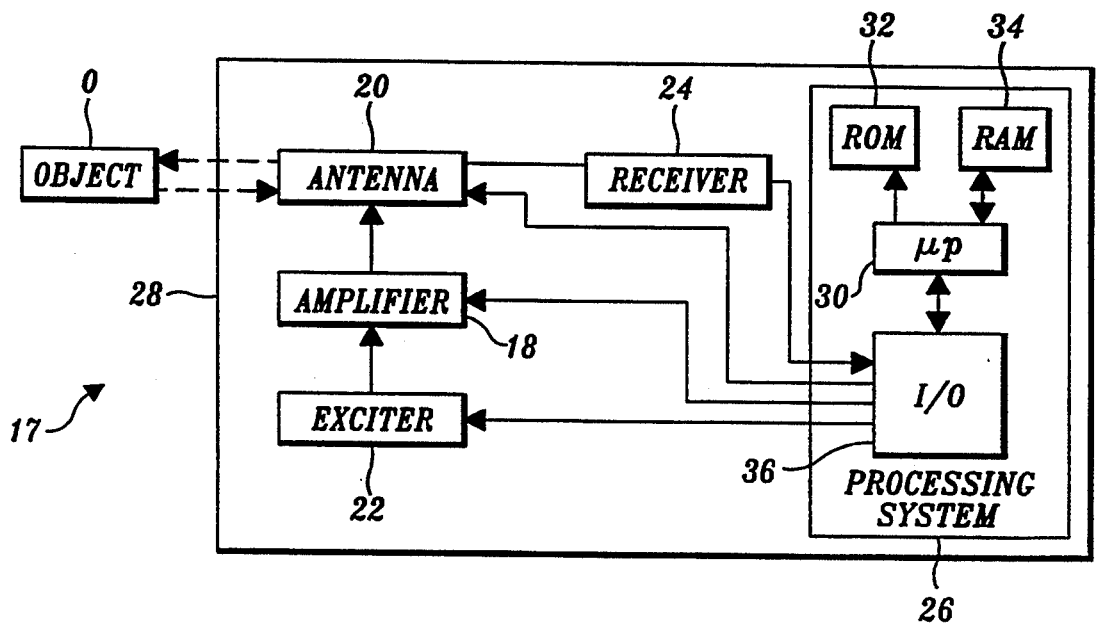
FIG. 2 is a block diagram of a frequency hopping radar system employing such an amplifier.

One particular application of system 16 is shown in greater detail in FIG. 2. In that regard, FIG. 2 illustrates a radar system 17 that includes a high-efficiency amplifier 18 (corresponding to amplifier 10), as well as an antenna 20, exciter 22, receiver 24, and processing system 26, all mounted on board a platform such as an aircraft 28. As will be discussed in greater detail below, the radar system 17 is used to determine the range and direction of some object O relative to the aircraft 28.

Before addressing the construction of amplifier 18 in greater detail, the remaining components of the radar system will be briefly considered. As a preliminary point, the radar system 17 may be designed to operate in any one of several alternative fashions. In the arrangement illustrated in FIG. 2, the radar system is designed to both transmit radio-frequency (RF) electromagnetic radiation to an object O and receive radiation reflected by object O. If, however, an auxiliary system (not illustrated) is employed, the radar system may only be required to transmit or receive radiation.

Antenna 20 is of any conventional design suitable for transmitting electromagnetic radiation to, and receiving reflected radiation from, object O over the desired frequency spectrum. For example, antenna 20 may be a mechanically scanned, horn-fed reflector or a servo-driven Cassegrain antenna. In the currently preferred arrangement, antenna 20 includes a phased array of individual elements whose collective antenna beam can be steered by controlling the relative phase of the elements' inputs and outputs. The directivity of antenna 20 is, thus, subject to control via an input from processing system 26.

The exciter 22 and receiver 24 are of any conventional design suitable for transmitting and receiving RF signals via the antenna 20. The exciter 22 and receiver 24 may be designed for use in pulsed or continuous wave (CW) modes of operation. By way of illustration, when used to transmit pulsed radiation, a synchronizer (not shown), and the exciter 22 produce a pulse of energy that is applied to amplifier 18. The output of amplifier 18 is coupled to antenna 20 by a transmit/receive switch (not shown), associated with the antenna. Some of the energy radiated by the antenna then returns as an echo signal, which is directed to receiver 24 by the transmit/receive switch. A mixer included in receiver 24 combines the RF echo with a local oscillator signal to produce an intermediate frequency (IF) output. The IF output is ultimately processed by system 26 to determine the range and direction of object O.

Of particular interest in the present case, the exciter 22 is also operable over a continuum of frequencies in response to inputs received from processing system 26. For example, the exciter 22 may operate over a substantial portion of the microwave spectrum. By regulating the operating frequency of exciter 22 and receiver 24, the bandwidth, antenna gain, and angular resolution of the radar system can also be controlled. Further, the influence of variables such as atmospheric attenuation and ionospheric refraction can be regulated by controlling the operating frequency of exciter 22 and receiver 24.

Like antenna 20, exciter 22, and receiver 24, the processing system 26 may be implemented in any of a variety of forms. In the preferred arrangement illustrated in FIG. 2, however, the processing system 26 includes a microprocessor 30, read-only memory (ROM) 32, random-access memory (RAM) 34, and input/output (I/O) interfaces 36. The ROM 32 is programmed with software instructions that govern the operation of microprocessor 30. The RAM 34 stores information input to the system and processed by microprocessor 30 during performance of the various program instructions. Finally, the interfaces 36 couple the microprocessor 30 to the remaining components of the radar system.

As will be described in greater detail below, the microprocessor 30 executes the various program instructions stored in ROM 32 to control the operation of amplifier 18, exciter 22, and receiver 24. In that regard, the CW or pulsed operation of antenna 20, exciter 22, and receiver 24 is conventional and readily understood by one of ordinary skill without further elaboration. Similarly, the determination of the range and direction of object O based upon information received from receiver 24 is conventional and not discussed in detail. The software instructions responsible for controlling the microprocessor 30 and amplifier 18 in response to variations in the operating frequency of the system are, however, not conventional and will be considered in greater detail below.

Figure 3:
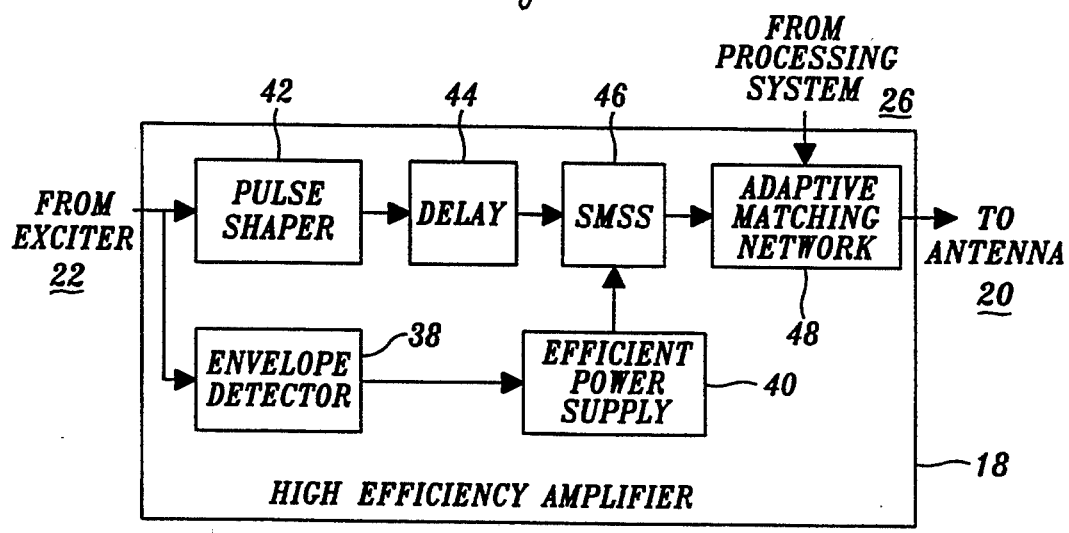
FIG. 3 is a block diagram of the amplifier of FIG. 1.

To begin that discussion, a more detailed illustration of the high-efficiency amplifier 18 is provided in FIG. 3. As shown, amplifier 18 includes an envelope detector 38, efficient power supply 40, pulse shaper 42, delay 44, switch mode signal source (SMSS) 46, and adaptive matching network 48.

A modulated RF input signal $V_S$, shown in FIG. 4 and having a variable frequency and bandwidth, is applied to the high-frequency amplifier 18. Signal $V_S$ is the input produced by the exciter 22 at the instigation of processing system 26 and, when amplified, is suitable for transmission to object O via the antenna 20.

As shown in FIG. 3, the input signal $V_S$ is applied to both the envelope detector 38 and pulse shaper 42. The envelope detector 38 is included to estimate the envelope of the narrow band signal $V_S$. As will be appreciated, this envelope, which defines the input signal $V_S$ substantially independent of carrier phase and frequency, must naturally be preserved during the amplification process. The output of envelope detector 38, representative of the envelope of $V_S$, is shown in FIG. 5.

Although the construction of the envelope detector 38 may be varied, in the preferred arrangement, envelope detector 38 is a multiphase rectifier. This rectifier includes a 90 degree hybrid power divider and two 180 degree hybrid power dividers with Schottky diode detectors on each port to allow for minimum filter delay on the envelope. The bandwidth of the envelope detector 38 is greater than or equal to the instantaneous bandwidth of signal $V_S$.

The efficient power supply 40 tracks and amplifies the output of envelope detector 38. The output of the efficient power supply 40 is shown in FIG. 6 and is employed to modulate the output of SMSS 46 with the information included in the envelope of the input signal $V_S$. The efficient power supply 40 may be of any suitable conventional design, with fast settling and wide bandwidth (e.g., as large as the instantaneous bandwidth of signal $V_S$).

As noted previously, at the same time the RF input signal $V_S$ is applied to envelope detector 38, it is also applied to the pulse shaper 42. In the preferred arrangement, pulse shaper 42 is a zero crossing detector employed to preserve the zero crossings of the RF input. As a result, the phase and frequency content of the RF input are preserved for use in establishing the switch times to be implemented by the SMSS 46. As shown in FIG. 7, the output of the pulse shaper 42 is, for example, a square wave.

Due to bandwidth limitations and signal path differences, the output of the efficient power supply 40 is delayed relative to the output of pulse shaper 42 by some time. Delay 44 introduces a corresponding time delay into the path between pulse shaper 42 and SMSS 46, ensuring a matched delay relationship between the switching and modulation inputs to SMSS 46. The resultant output of delay 44 is illustrated in FIG. 8. The delay 44 also may be of any suitable conventional design.

The SMSS 46 is included to provide the amplified output desired from amplifier 18. In that regard, SMSS 46 produces the output illustrated in FIG. 9 in response to the switching input from delay 44 and the power input from efficient power supply 40. Thus, the pulse shaper 42 controls the phase and frequency of the SMSS output, while power supply 40 modulates the envelope of the SMSS output.

As will be appreciated, the switch mode signal source 46 may have any of a number of alternative constructions. In a preferred arrangement, however, SMSS 46 includes a Class E amplifier employing high-speed, static induction transistors (SITs) either singly or in a push-pull configuration. Additional details regarding the construction of such amplifiers are provided in, for example, the Avratoglou et al. and Kazimierczuk et al. references noted above.

Addressing now the construction of the adaptive matching network 48, network 48 is designed to provide an output, depicted in FIG. 10, that remains adequately matched to the load (e.g., antenna 20), regardless of changes in system operating frequency. The processing system 26 and adaptive matching network 48 cooperatively monitor power applied to the load for each operating frequency. The processing system 26 then iteratively adjusts the adaptive matching network 48, in response to the load power sensed the last time the radar system was operated at the same frequency, to match the amplifier 18 to the load and increase efficiency at the present time. By using a previously sensed indication of matching network variables, rather than a real time determination, the ability of the radar system to respond to rapid frequency variations is enhanced.

Figure 11:
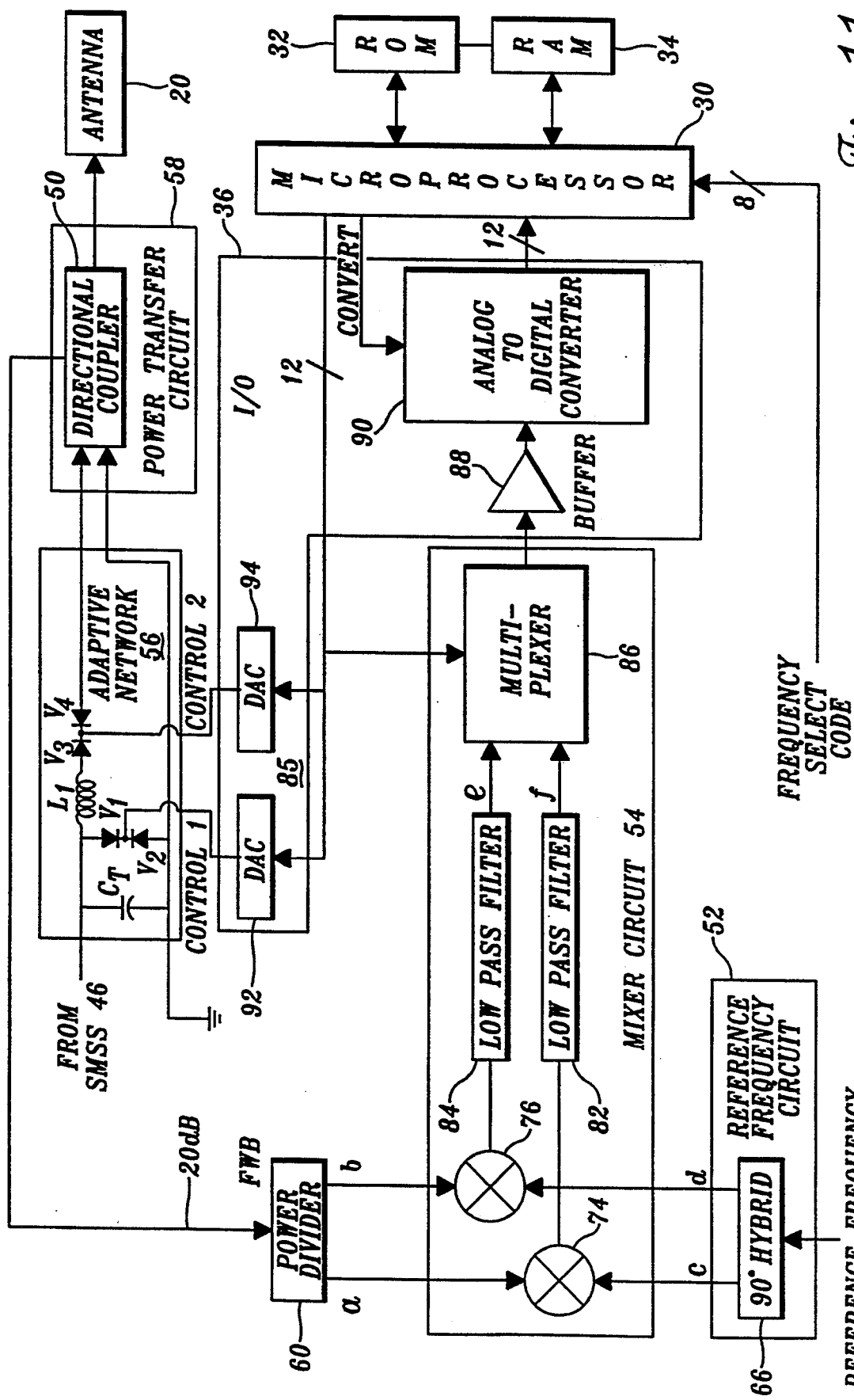
FIG. 11 is a block diagram of an adaptive matching network included in the amplifier of FIG. 3.

The adaptive matching network 48 is illustrated in greater detail in FIG. 11, along with a portion of the processing system 26. More particularly, the adaptive matching network 48 is depicted as including a power transfer circuit 50, reference frequency circuit 52, mixing circuit 54, and adaptive network 56.

Addressing these basic components of the adaptive matching network 48 in greater detail, the power transfer circuit 50 is included to allow the processing system 26 to determine the incident power applied from amplifier 18 to the load (e.g., antenna 20). A directional coupler 58 applies the output of the adaptive network 56 to the load. At the same time, the directional coupler 58 applies this "incident" load signal to a power divider 60, which is also part of the power transfer 50, although shown separately in the Figure. In the preferred arrangement, the directional coupler attenuates the transmission of signals by, on the order of, twenty dB.

The power divider 60 divides the incident signal into two separate outputs of roughly equal power. As a result, two equal-power incident signals are produced at output terminals a and b of the power divider. The power divider 60 is designed to introduce minimal losses into the circuit.

The reference frequency circuit 52 is included to produce two referential outputs for use by the mixing circuit 54 in producing intermediate-frequency (IF) outputs. In that regard, the reference frequency circuit 52 includes a 90° hybrid 66, which receives a reference frequency input from, for example, the exciter 22.

The 90° hybrid 66 includes an input port and two output ports, c and d. The output produced at output port d and the input to the second port, shifted by 90° relative to the signal is applied to the input port. The output from output port c is, on the other hand, identical to the input signal. One input port of hybrid 66 is terminated in a matched load. As a result, the outputs produced by hybrid 66 has the following characteristics.

As shown in FIG. 11, the mixing circuit 54 receives inputs a and b from power transfer circuit 50 and inputs c and d from reference frequency circuit 52. The mixing circuit 54 includes a first mixer 74, which receives input a from power divider 60 and input c from 90° hybrid 66. A second mixer 76 receives input b from power divider 60 and input d from 90° hybrid 66.

First and second mixers 74 and 76 cooperatively mix their two inputs to produce DC outputs containing both amplitude and phase information regarding the incident power applied to the load. Specifically, the DC output of first mixer 74 represents a direct component of the incident power, while the DC output of second mixer 76 represents a quadrature component of that power.

The DC outputs of mixers 74 and 76 are applied to low pass filters 82 and 84, respectively. The low pass filters 82 and 84 are employed to remove, for example, high frequency noise content in the mixer outputs, the reference frequency, and twice the reference frequency. Although the construction of these filters may vary, in the preferred arrangement, each filter has a cutoff frequency of roughly 10 kilohertz.

A multiplexer 86 receives the outputs of low pass filters 82 and 84 on inputs e and f. The multiplexer 86 then allows these components of the incident signal to be provided serially to processing system 26 via interface 36. As will be appreciated, the multiplexer must be designed to operate sufficiently over an appropriately wide frequency band.

The serially transmitted, analog output of mixing circuit 54 is then conditioned by a buffer 88 for conversion to digital form by a twelve-bit, analog-to-digital (A/D) converter 90. As a result, digital information regarding the incident and reflected power at the load is available to microprocessor 30. The buffer 88 and A/D converter 90 are part of interface 36 and are conventional in design.

As shown in FIG. 11, the interface 36 also includes two digital-to-analog (D/A) converters 92 and 94. These converters 92 and 94 convert digital outputs of microprocessor 30 into first and second analog control signals (Control 1 and Control 2), suitable for use in regulating the operation of the adaptive network 56.

The adaptive network 56 illustrated in FIG. 11 includes a capacitor $C_T$, representative of the capacitance of the transistor included in the SMSS 46. First and second varactors, or variable capacitance diodes, $V_1$ and $V_2$ are connected in parallel with capacitor $C_T$. Specifically, the cathodes of varactors $V_1$ and $V_2$ are connected together to form a first control junction, while the anodes are connected to the output of SMSS 46. The Control 1 signal can be applied to the first control junction to control the capacitances of varactors $V_1$ and $V_2$.

An inductor $L_1$ and third and fourth varactors $V_3$ and $V_4$ are connected in series with the anode of varactor $V_1$. More particularly, the inductor $L_1$ is connected between the anodes of varactors $V_1$ and $V_3$. The anode of varactor $V_4$ is coupled to the load and the cathodes of varactors $V_3$ and $V_4$ are joined to form a second control junction. The Control 2 signal is applied to the second control junction to control the relative capacitance of varactors $V_3$ and $V_4$.

The capacitance of capacitor $C_T$ may be on the order of roughly 20 picofarads. Similarly, the capacitances of varactors $V_1$, $V_2$, $V_3$, and $V_4$ may range anywhere from 2 to 100 picofarads, depending upon the Control 1 and Control 2 signals applied. The inductor $L_1$ exhibits an inductance on the order of roughly 25 nanohenries.

As will be described in greater detail below, the Control 1 and Control 2 signals applied to the adaptive network 56 are regulated to ensure that maximum power is transferred to the load, regardless of changes in the radar system 17 that occur with time or frequency. The microprocessor 30 achieves these objectives by determining the incident power and adjusting varactors $V_1$, $V_2$, $V_3$, and $V_4$ to maximize the power. Although the power transferred is determined for the present operating frequency, the microprocessor 30 actually adjusts adaptive network 56 on the basis of the power calculated the last time the system was operated at the same frequency. As a result, the system is better able to respond to rapid variations in, for example, operating frequency.

Reviewing this process in greater detail, assume that radar system is operating at a first frequency $f_1$. As previously noted, the microprocessor 30 controls the adaptive network 56 to properly match the amplifier to the load for the given operating frequency. The steps performed by microprocessor 30 to achieve the desired control are illustrated in the flow chart of FIG. 12.

The microprocessor 30 is first initialized at block 96. As part of this initialization, the microprocessor 30 accesses the program instructions stored in ROM 32, along with data to be used in performing the operations dictated by the program instructions. Of particular importance, the ROM 32 also stores a plurality of pairs of twelve bit words, each of which is associated with a different potential operating frequency of the radar system. These word pairs are representative of the Control 1 and Control 2 signals to be applied to the adaptive network 56 the first time the radar system is operating at the corresponding frequencies.

With microprocessor 30 initialized, the "incident" output from SMSS 46 is partially directed by directional coupler 58 to power divider 60. The power divider 60 provides equal power outputs a and b to mixers 74 and 76. These signals are mixed with reference outputs c and d from the reference frequency circuit 52, as described above. The outputs of mixers 74 and 76 collectively provide information regarding the magnitude and phase of the incident signals and are processed by low pass filters 82 and 84 for application to multiplexer 86.

At the same time, the directional coupler 58 transfers the incident signal to the load. To match the network to the load, the microprocessor 30, at block 98, determines the initial operating frequency $f_1$ of the radar system. Specifically, an eight-bit, frequency select code, produced by exciter 22 and representative of the operating frequency, is monitored.

The microprocessor 30 then determines, at block 100, whether the radar system has previously been operated at that same frequency. Assuming that the operation of the radar system has just been initiated, the system was not previously operated at frequency $f_1$. Under that circumstance, the microprocessor 30 retrieves the initialized word pair associated with operating frequency $f_1$ from ROM 32 at block 102.

Next, at block 104, the microprocessor 30 causes the two digital words to be converted into the analog control signals Control 1 and Control 2 by D/A converters 92 and 94. These signals are, in turn, applied to the adaptive network 56. In the preferred arrangement, the initialized words are established so that, with the resultant Control 1 and Control 2 signals applied to the first and second control junctions, the varactors $V_1$, $V_2$, $V_3$, and $V_4$ will be at roughly the calculated center frequency for the frequency select code. Although a center frequency setting of the adaptive network 56 may not provide an optimal match between the amplifier 18 and the load, it provides an acceptable initial starting point from which more refined adjustments can subsequently be made. After the adaptive network 56 is adjusted, the incident signal from exciter 22, amplified by the SMSS 46, is applied to the load.

With information regarding incident signals included in the output of multiplexer 86, the microprocessor 30 then polls this output at block 106. At block 108, microprocessor 30 determines the power P for frequency $f_1$. As will be appreciated, the multiplexer outputs are representative of voltage. Given that the incident signals are exposed to the load, the power is proportional to the square of the incident power.

At block 108, the microprocessor 30 computes the partial derivatives of P with respect to the two variable Control 1 and Control 2 signals by independently incrementing the Control 1 and Control 2 signals. In that regard, P can be expressed as:

$$P = \frac{t^2 + u^2}{V^2} \quad (1)$$

where t is the output of low pass filter 84, u is the output of low pass filter 82, and $V^2$ is the square of the efficient power supply voltage. The relationship between P and the Control 1 and Control 2 signals can thus be expressed by the components of the directional derivatives:

$$\frac{dP}{d\text{Control 1}} = P_{\Delta 1} - P = t_1^2 + V_1^2 - P \quad (2)$$

$$\frac{dP}{d\text{Control 2}} = P_{\Delta 2} - P = t_2^2 + u_2^2 - P \quad (3)$$

where $\Delta 1$ is some incremental adjustment in the Control 1 a signal; $P_{\Delta 1}$ is P produced by the adjustment in the Control 1 signal; $t_1$ and $u_1$ are the outputs of low pass filters 84 and 82, respectively, produced by the adjustment in the Control 1 signal; $\Delta 2$ is some incremental adjustment in the Control 2 signal; $P_{\Delta 2}$ is P produced by the adjustment in the Control 2 signal; and $t_2$ and $u_2$ are the outputs of low pass filters 84 and 82, respectively, produced by the adjustment in the Control 2 signal. The partial derivatives $dP/(d\text{Control 1})$ and $dP/(d\text{Control 2})$, which are determined at block 108 by independently incrementing the Control 1 and Control 2 signals some predetermined amount, effectively represent the slope of the power P when plotted as a function of the Control 1 and Control 2 increments.

Then, at block 110, initial estimates of the desired corrections $\Delta 1$ and $\Delta 2$ in the Control 1 and Control 2 signals are computed in accordance with the following expressions, which are dependent upon both Control signals:

$$\Delta 1 = -\frac{\frac{dP}{d\text{Control 1}}\left(\frac{P}{2}\right)}{\left(\frac{dP}{d\text{Control 1}}\right)^2 + \left(\frac{dP}{d\text{Control 2}}\right)^2} \quad (4)$$

$$\Delta 2 = -\frac{\frac{dP}{d\text{Control 2}}\left(\frac{P}{2}\right)}{\left(\frac{dP}{d\text{Control 1}}\right)^2 + \left(\frac{dP}{d\text{Control 2}}\right)^2} \quad (5)$$

Equations (4) and (5) are expressed in a form designed to assure the convergence of the multivariate directional derivative (i.e., the derivative of P with respect to both Control signals), so that the system does not become unstable or oscillate. More particularly, squaring the two partial derivatives in the denominator and multiplying P by some K factor (K=½ in equations (4) and (5)) contribute to this convergence. As will be appreciated, however, alternative expressions may be employed. For example, K factors less than one-half may be used, with a resultant decrease in the rate of convergence.

The corrections Δ1 and Δ2 are then further tested at block 112 for convergence by determining whether either Δ1 or Δ2 is greater than one-half. In the event either one exceeds one-half, new estimates Δ1' and Δ2' are computed as follows:

$$\Delta 1' = \frac{\Delta 1}{\sqrt{\Delta 1^2 + \Delta 2^2}} \qquad (6)$$

$$\Delta 2' = \frac{\Delta 2}{\sqrt{\Delta 1^2 + \Delta 2^2}} \qquad (7)$$

As will be appreciated, these equations represent the corrections to be made to both the Control 1 and Control 2 signals the next time the system operates at this frequency. These values are then stored by microprocessor 30 in RAM 34 at block 114, before operation of the loop is restored to block 98.

As will be appreciated, the directional derivative discussed above will be equal to zero at a point of inflection, representative of, for example, a minimum or maximum of P. Thus, the microprocessor 30 is essentially searching for new values of the Control 1 and Control 2 signals that will allow the directional derivative for the particular operating frequency $f_1$ to more nearly approach zero.

At block 98, the operating frequency is again monitored. In a frequency-hopping system, the frequency may change rapidly causing the frequency to be different each iteration of the loop. Assuming that a new operating frequency $f_2$ has been established, the microprocessor 30 will repeat the steps outlined above, using a new pair of initialized words associated with frequency $f_2$.

After the radar system has been operating for some time, the microprocessor 30 may determine at block 100 that the system has previously been operated at the same frequency. Thus, at block 116, microprocessor 30 will retrieve the control words previously stored in RAM 34 (block 114) for that frequency. These words are then used to generate appropriate Control 1 and Control 2 outputs in the manner previously discussed. In general, the Control 1 and Control 2 inputs will decrease as the operating frequency increases, and increase as the operating frequency decreases.

Figure 12:
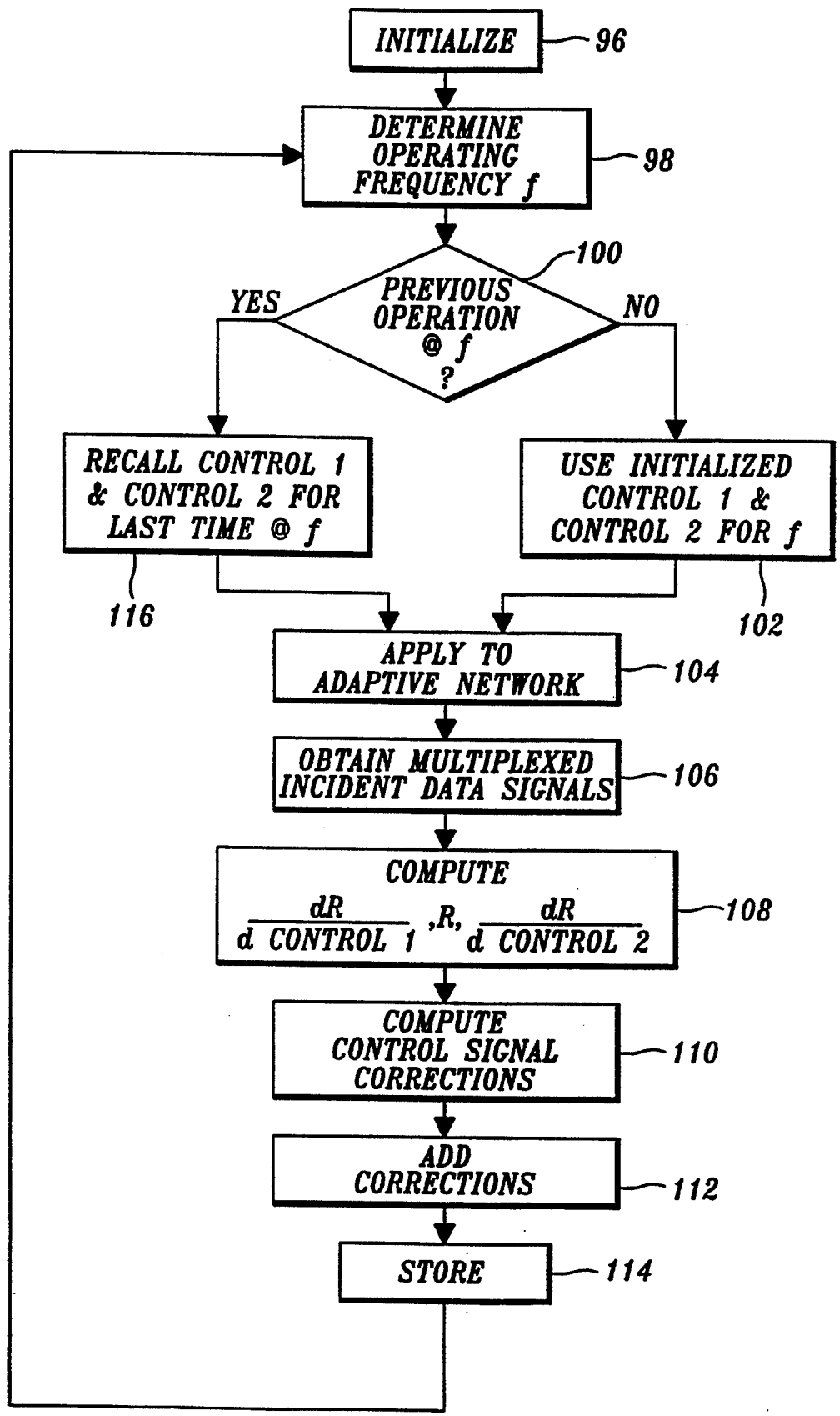
FIG. 12 is a flow chart depicting the way in which the adaptive matching network of FIG. 11 is controlled.

The operation of microprocessor 30 depicted in FIG. 12 continues to loop, adaptively adjusting the Control 1 and Control 2 inputs to the first and second control junctions of the varactors as the operating frequency of the radar system changes. If the operating frequency of the system is set randomly, the adjustments to the Control 1 and Control 2 inputs will also occur randomly. In that regard, a particular operating frequency f may repeat relatively soon, in which case adjustments to the Control 1 and Control 2 inputs for that frequency will occur more rapidly. Alternatively, a particular operating frequency may recur only after an extended interval, in which case the Control 1 and Control 2 inputs for that frequency will be updated relatively infrequently.

Operated in the foregoing manner, the microprocessor 30 adjusts the Control 1 and Control 2 signals applied to the adaptive matching network 56 the next time the particular operating frequency f is employed. Although, the software stored in ROM 32 could be altered to allow adjustments to be made immediately, the arrangement described above is preferred because it enhances the ability of the system to react and adapt to frequency changes. Specifically, the microprocessor 30 is able to provide Control 1 and Control 2 inputs to adaptive network 56 at block 104 as soon as the frequency is determined at block 98, rather than waiting until block 112. As a result, the operational speed of the system is greatly enhanced.

Figure 13:
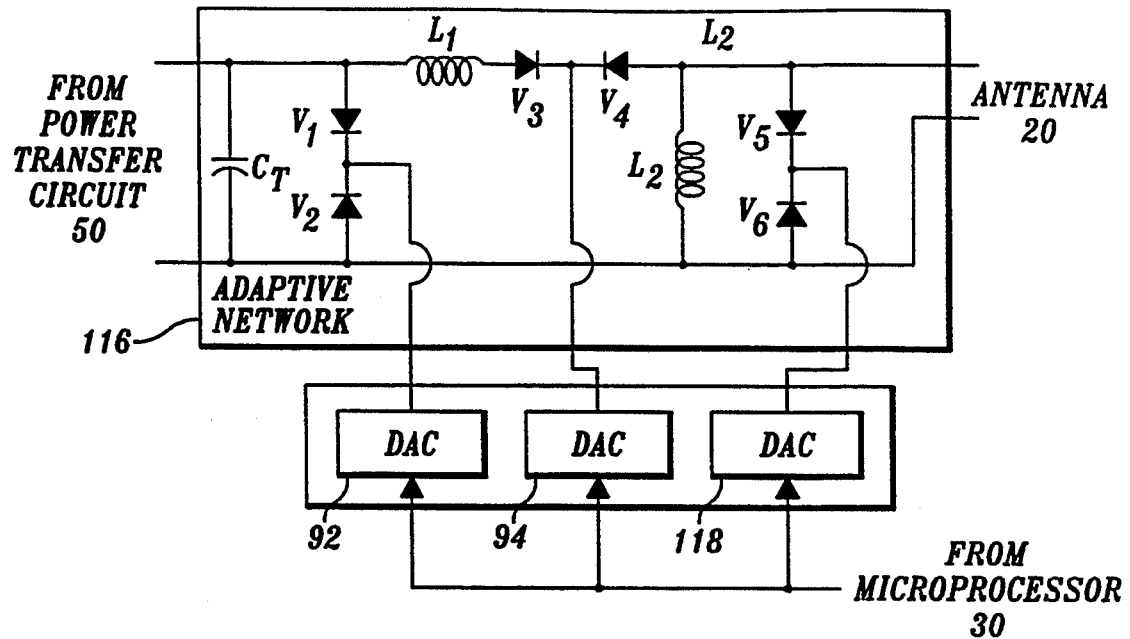
FIG. 13 is a block diagram illustrating an alternative network that may be used in the adaptive matching network of FIG. 11.

As an alternative to the adaptive control network 56 illustrated in FIG. 11, the network 116 shown in FIG. 13 can be employed to offer a greater bandwidth. Network 116 is the same as network 56, with the exception that two additional varactors $V_5$ and $V_6$ have been added. Specifically, the cathodes of varactors $V_5$ and $V_6$ are connected together to form a third control junction, which is supplied with a Control 3 signal by a third D/A converter 118. The anode of varactor $V_5$ is coupled to the anode of varactor $V_4$ by an inductor $L_2$ and the anode of varactor $V_6$ is coupled to the load.

The inclusion of a third pair of varactors also requires modifications in the software responsible for making the requisite adjustments in the various control signals. More particularly, at block 108, a third partial derivative dP/(dControl 3) is computed. The corrections Δ1 and Δ2 are then computed at block 110 by adding the square of the partial derivative dP/(dControl 3) to the denominator of equations (4) and (5). Similarly, a third correction Δ3 is computed as:

$$\Delta 3 = \qquad (8)$$

$$\frac{\frac{dP}{d\text{Control 3}}\left(\frac{P}{2}\right)}{\left(\frac{dP}{d\text{Control 1}}\right)^2 + \left(\frac{dP}{d\text{Control 2}}\right)^2 + \left(\frac{dP}{d\text{Control 3}}\right)^2}$$

A test is then performed to determine whether the initial correction estimates Δ1, Δ2, and Δ3 are greater than one-half. In the event any one of the three estimates exceed one-half, revised estimates Δ1' and Δ2' are computed in accordance with equations (6) and (7), modified by the inclusion of a "Δ3²" term under the radical in the denominator. Similarly, Δ3' is determined as:

$$\Delta 3' = \frac{\Delta 3}{\sqrt{\Delta 1^2 + \Delta 2^2 + \Delta 3^2}} \qquad (9)$$

The remainder of the software's operation remains the same.

Figure 14:
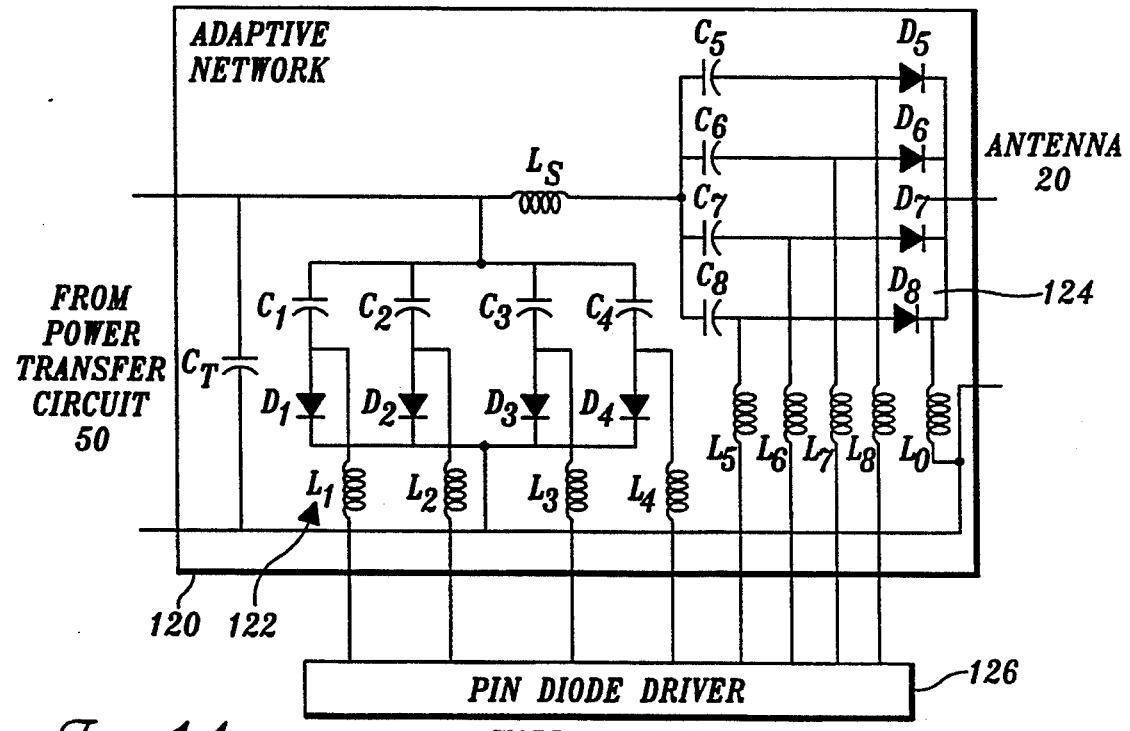
FIG. 14 is a block diagram illustrating another alternative network that may be used in the adaptive matching network of FIG. 11.

Another alternative to the adaptive control network 56 of FIG. 11 is shown in FIG. 14. There, a "digital" network 120 is coupled directly to microprocessor 30 without intervening D/A converters 92 and 94. The varactor pairs $V_1$, $V_2$, $V_3$, and $V_4$ are also replaced by parallel arrays of capacitors coupled by pin diodes.

More particularly, a first array 122 is connected in parallel with capacitor $C_T$. Array 122 includes a first capacitor $C_1$, having a predetermined capacitance coupled in series with a first pin diode $D_1$. A first inductor $L_1$ is coupled between those two components and pin diode driver 126. A second capacitor $C_2$, second inductor $L_2$, and second pin diode $D_2$, a third capacitor $C_3$, third inductor $L_3$, and third pin diode $D_3$, and a fourth capacitor $C_4$, fourth inductor $L_4$, and fourth pin diode $D_4$, are connected in parallel with first capacitor $C_1$, first inductor $L_1$, and first diode $D_1$. The capacitances of $C_2$, $C_3$, and $C_4$ are equal to one-half, one-fourth, and one-eighth the capacitance of $C_1$, respectively.

Similarly, a second array 124 is connected between an inductor $L_5$ and the load. Array 124 also includes a fifth capacitor $C_5$ and pin diode $D_5$, connected in parallel with a sixth capacitor $C_6$ and pin diode $D_6$, seventh capacitor $C_7$ and pin diode $D_7$, and eighth capacitor $C_8$ and pin diode $D_8$. Fifth, sixth, seventh, and eighth inductors $L_5$, $L_6$, $L_7$, and $L_8$, respectively, are coupled between pin diode driver 126 and the series connections of the corresponding pin diodes and capacitors of this array. An inductor $L_0$ is coupled between the output of the array and one input line.

Four-bit digital words Control 1 and Control 2 are applied from microprocessor 30 to pin diode driver 126 to control arrays 122 and 124. Each bit of the control words is applied to a different one of the arrays' pin diodes, selecting the various capacitors $C_1$, $C_2$, $C_3$, and $C_5$, $C_6$, $C_7$, and $C_8$ that are activated. As a result, the words control the arrays' capacitance. Thus, the software remains essentially the same as described above, with the only real difference being the production of a digital, rather than analog, output to achieve the desired adjustment.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An amplifier for processing an input signal to produce an amplified output signal, the input signal having a modulated envelope and a frequency that may shift among a plurality of different frequencies, said amplifier comprising:
    pulse shaping means for processing the input signal to produce a shaped signal exhibiting the same frequency and phase as the input signal;
    envelope detection means for processing the input signal to produce an envelope signal that represents the envelope of the input signal;
    power supply means for tracking and amplifying the envelope signal to produce a supply signal; and
    switch-mode signal source means for receiving the shaped signal and the supply signal and for producing an amplified signal whose phase and frequency are determined by the shaped signal and whose envelope is modulated by the supply signal.

2. The amplifier of claim 1, wherein said envelope detection means and said power supply means cause the supply signal to be delayed relative to the input signal, and wherein said amplifier further comprises delay means for delaying the shaped signal before it is received by said switch-mode signal source means.

3. The amplifier of claim 1, wherein said pulse-shaping means comprise a zero-crossing detector that produces a square-wave signal, said envelope detection means comprise a multiphase rectifier, said power supply means comprise a high-efficiency power supply, and said switch-mode signal source means comprise a class-E amplifier.

4. The amplifier of claim 1, wherein said switch-mode signal source means include a first terminal at which the output signal is produced and a second terminal at which the amplifier output is produced, further comprising:
    first and second varactors, coupled at a first junction, said first varactor further being coupled to said first terminal and said first and second varactors being coupled in parallel with said switch-mode signal source means;
    an inductor, coupled to said first terminal;
    third and fourth varactors, coupled at a second junction, said third varactor further being coupled to said inductor and said fourth varactor further being coupled to said second terminal.

5. The amplifier of claim 4, further comprising:
    sensor means, for producing a sensor signal;
    control means for applying control inputs to said first and second junctions in response to the sensor signal to control the capacitance of the first and second varactors.

6. The amplifier of claim 5, wherein said control means includes memory means for storing the control inputs when the input signal is at the particular frequency, said control means being further for retrieving the inputs and applying them to said first and second junctions when the input signal is at the particular frequency a subsequent time.

7. The amplifier of claim 4, further comprising a second inductor and fifth and sixth varactors coupled between said fourth varactor and said second terminal, said second inductor being coupled to said fourth varactor, said fifth and sixth varactors being coupled at a third junction, said fifth varactor being coupled to said second inductor and said sixth varactor being coupled to said second terminal.

8. The amplifier of claim 1, wherein said switch-mode signal source means include a first terminal at which the output signal is produced and wherein said adaptive matching means includes a second terminal at which the amplifier output is produced, further comprising:
    an inductor coupled to said first terminal;
    a first array of at least two pairs of series-connected pin diodes and capacitors, said at least two pairs of said first array being coupled in parallel with each other and said switch-mode signal source means; and
    a second array of at least two pairs of series-connected pin diodes and capacitors, said at least two pairs of said second array being coupled in parallel with each other and in series between said inductor and said second terminal.

9. An amplifier for processing an input signal to produce an amplified output signal having a modulated envelope, said amplifier comprising:
    pulse-shaping means for processing the input signal to produce a shaped signal exhibiting the same frequency and phase as the input signal;
    envelope detection means for processing the input signal to produce an envelope signal that represents the envelope of the input signal;
    power supply means for tracking and amplifying the envelope signal to produce a supply signal; and
    switch-mode source means for receiving the shaped signal and the supply signal and for producing an amplified signal whose phase and frequency are determined by the shaped signal and whose envelope is modulated by the supply signal.

* * * * *

UNITED STATES PATENT AND TRADEMARK OFFICE
CERTIFICATE OF CORRECTION

PATENT NO. : 5,339,041
DATED : August 16, 1994
INVENTOR(S) : J.H. Nitardy

It is certified that error appears in the above-indentified patent and that said Letters Patent is hereby corrected as shown below:

| COLUMN | LINE | |
|---|---|---|
| 10 | 29 | "1 a signal" should read --1 signal-- |
| 13 | 21 and 22 | "$C_1$, $C_2$, $C_3$, and $C_5$, $C_6$, $C_7$, and $C_8$" should read --$C_1$, $C_2$, $C_3$, and $C_4$, and $C_5$, $C_6$, $C_7$, and $C_8$-- |

Signed and Sealed this

Sixth Day of December, 1994

Attest:

BRUCE LEHMAN

*Attesting Officer*          *Commissioner of Patents and Trademarks*